(12) United States Patent
Nair et al.

(10) Patent No.: US 9,130,161 B2
(45) Date of Patent: Sep. 8, 2015

(54) VIBRATION ENERGY HARVESTING APPARATUS

(75) Inventors: Balakrishnan Nair, Sandy, UT (US); Zachary Murphree, Salt Lake City, UT (US)

(73) Assignee: Oscilla Power Inc., Seattle, WA (US)

( * ) Notice: Subject to any disclaimer, the term of this patent is extended or adjusted under 35 U.S.C. 154(b) by 261 days.

(21) Appl. No.: 13/333,173

(22) Filed: Dec. 21, 2011

(65) Prior Publication Data
US 2012/0326536 A1    Dec. 27, 2012

Related U.S. Application Data

(60) Provisional application No. 61/425,753, filed on Dec. 21, 2010, provisional application No. 61/482,146, filed on May 3, 2011.

(51) Int. Cl.
*H02N 2/00*     (2006.01)
*H01L 41/12*    (2006.01)
*H02N 2/18*     (2006.01)

(52) U.S. Cl.
CPC .............. *H01L 41/125* (2013.01); *H02N 2/186* (2013.01); *H02N 2/188* (2013.01)

(58) Field of Classification Search
CPC ........... H02N 2/00; H02N 2/18; H02N 2/186; H02N 2/188
USPC ...................... 310/26, 339; 331/157; 318/118
IPC ......................................................... H02K 2/00
See application file for complete search history.

(56) References Cited

U.S. PATENT DOCUMENTS

| 5,982,054 | A  | * | 11/1999 | Rathore et al. ................. 310/26 |
| 6,504,258 | B2 | * | 1/2003  | Schultz et al. ................ 290/1 R |
| 6,804,994 | B2 | * | 10/2004 | Shimada ...................... 73/11.03 |
| 7,199,480 | B2 | * | 4/2007  | Fripp et al. .................... 290/1 R |
| 7,414,351 | B2 | * | 8/2008  | Ulm et al. ...................... 310/330 |

FOREIGN PATENT DOCUMENTS

JP        09090065 A  *  4/1997     ............. G04C 10/00

OTHER PUBLICATIONS

Machine Translation, Miyazaki et al. JP 09090065 A, Apr. 4, 1997.*

* cited by examiner

*Primary Examiner* — Thomas Truong
(74) *Attorney, Agent, or Firm* — Jeffrey T. Holman

(57) ABSTRACT

An apparatus for harvesting energy is described. The apparatus includes a vibration component and a moving mass. The vibration component has a first and second end and further includes a magnetostrictive material. The vibration component further includes a conduction coil wrapped around the magnetostrictive material. The moving mass is coupled to the second end of the vibration assembly. The mass is configured to move in an oscillating path in response to forces acting on the vibration energy harvesting apparatus, inducing strain on the magnetostrictive material. The strain on the magnetostrictive material changes a magnetic property of the magnetostrictive material, inducing electrical energy in the conduction coil wrapped around the magnetostrictive material. Other embodiments of the apparatus are also described.

12 Claims, 7 Drawing Sheets

VIBRATION ENERGY HARVESTING APPARATUS

CROSS-REFERENCE TO RELATED APPLICATIONS

This application claims the benefit of U.S. Provisional Application No. 61/425,753, filed on Dec. 21, 2010, entitled "Vibration Energy Harvester Method and Device." This application further claims the benefit of U.S. Provisional Application No. 61/482,146, filed on May 3, 2011, entitled "Method and Device for Vibration Energy Harvesting." Each of these references is incorporated by reference in their entirety.

BACKGROUND

Power generation from mechanical vibration usually uses ambient vibration around the power harvesting device as a source of energy. The power harvesting device converts the ambient vibration into useful electrical energy, in order to increase energy efficiency or power other devices. Some examples of conventional methods of harvesting energy from a vibrating system include using mechanical vibration to apply strain energy to a piezoelectric material or to cause relative displacement between a magnet and coil. These methods usually involve the use of very low reliability materials. Additionally, these methods usually depend on significant relative motion, which is difficult to implement at high frequency.

Many types of vibration energy harvesters are known in the literature. At least two of the common types include (1) Harvesters that utilize magnets that move relative to conductive coils so as to generate an induced current and/or voltage within the coils, and (2) Harvesters that utilize piezoelectric elements that undergo stress changes resulting in electric current and/or voltage in these elements.

While viable for very small scale power production, both of these approaches have specific difficulties in scaling up to power levels of 0.1 W or above, and more specifically 1 W or above, especially if such power production is to be maintained across a wide-range of vibration frequencies.

Moving magnet designs depend on significant relative motion to be able to produce significant power. At the high frequency (about 10-500 Hz), which represents a moderate acceleration (1-10 Gs) vibration environment typical of many types of machinery, the high displacements needed to make watts (i.e., one watt or more) of power are difficult to achieve in moving magnet designs. Further, if more powerful magnets are used to increase power density, cogging forces/torques become difficult to overcome and structural stiffness requirements become exceedingly more demanding.

Piezoelectrics, being semiconducting ceramics, have intrinsic issues related to high internal resistance and/or high internal impedance, and low structural reliability that prevent them from being usefully scaled up for broad band power generation of the order of even watts (i.e., one watt or more) and have thus been largely limited to the micro-watt to milliwatt ranges.

Power generation using other magnetostrictive elements have been explored, such as galfenol and other magnetostrictive materials, but have encountered difficulties regarding design, power density, and prohibitive costs for achieving effective power generation.

SUMMARY

Embodiments of an apparatus are described. In one embodiment, the apparatus is a vibration energy harvesting apparatus. The apparatus includes a vibration component and a moving mass. The vibration component has a first and second end and further includes a magnetostrictive material. The vibration component further includes a conduction coil wrapped around the magnetostrictive material. The moving mass is coupled to the second end of the vibration assembly. The mass is configured to move in an oscillating path in response to forces acting on the vibration energy harvesting apparatus, inducing strain on the magnetostrictive material. The strain on the magnetostrictive material changes a magnetic property of the magnetostrictive material, inducing electrical energy in the conduction coil wrapped around the magnetostrictive material. Other embodiments of the apparatus are also described.

Embodiments of an apparatus are also described. In one embodiment, the apparatus is an apparatus for energy production. The apparatus includes a moving mass configured to oscillate in response to an external force on the apparatus. The apparatus further includes a spring element coupled to the moving mass. The apparatus also includes a magnetic strain material coupled to the spring element. The spring element is configured to induce strain on the magnetic strain material in response to movement of the moving mass. The apparatus also includes an electrical conductor disposed within a vicinity of the magnetic strain material. An electrical property of the electrical conductor varies depending on a change in the strain induced on the magnetic strain material. Other embodiments of the apparatus are also described.

Embodiments of an apparatus are also described. In one embodiment, the apparatus is an apparatus for energy production. The apparatus includes a cantilever beam assembly with a fixed and a free end. The cantilever beam includes at least two magnetostrictive elements spanning the length between the fixed and free end of the cantilever beam assembly. The apparatus further includes a moving mass fixed to the free end of the cantilever beam. Movement of the moving mass creates a compressive or tensile force on the magnetostrictive elements as the moving mass moves relative to the fixed end of the cantilever beam assembly. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
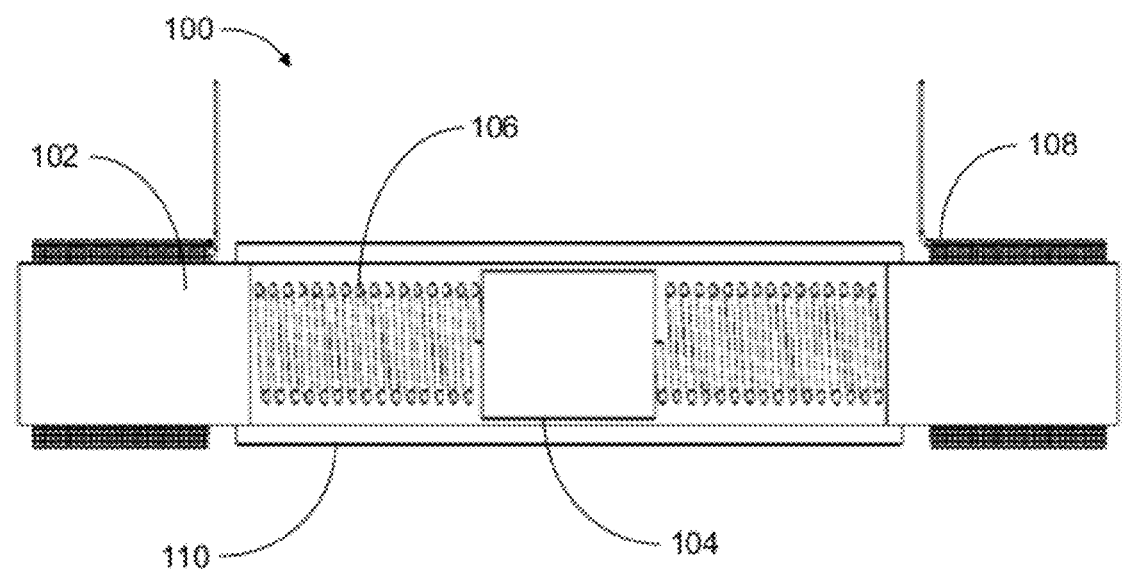
FIG. 1 depicts a schematic diagram of one embodiment of an apparatus for energy production comprising a spring element.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

The term magnetic strain material as used herein covers materials that are generally known to possess specific magnetic properties which change in response to mechanical strain (or alternatively exhibit a mechanical strain in response to a change in the magnetic properties). Some examples of magnetic strain materials include, but are not limited to, magnetostrictive materials, piezomagnetic materials, etc. Permanent magnet materials which do not exhibit a relationship between mechanical strain and magnetic properties are not considered magnetic strain materials. In some embodiments, permanent magnets, generally, are not considered magnetic strain materials.

Figure 2:
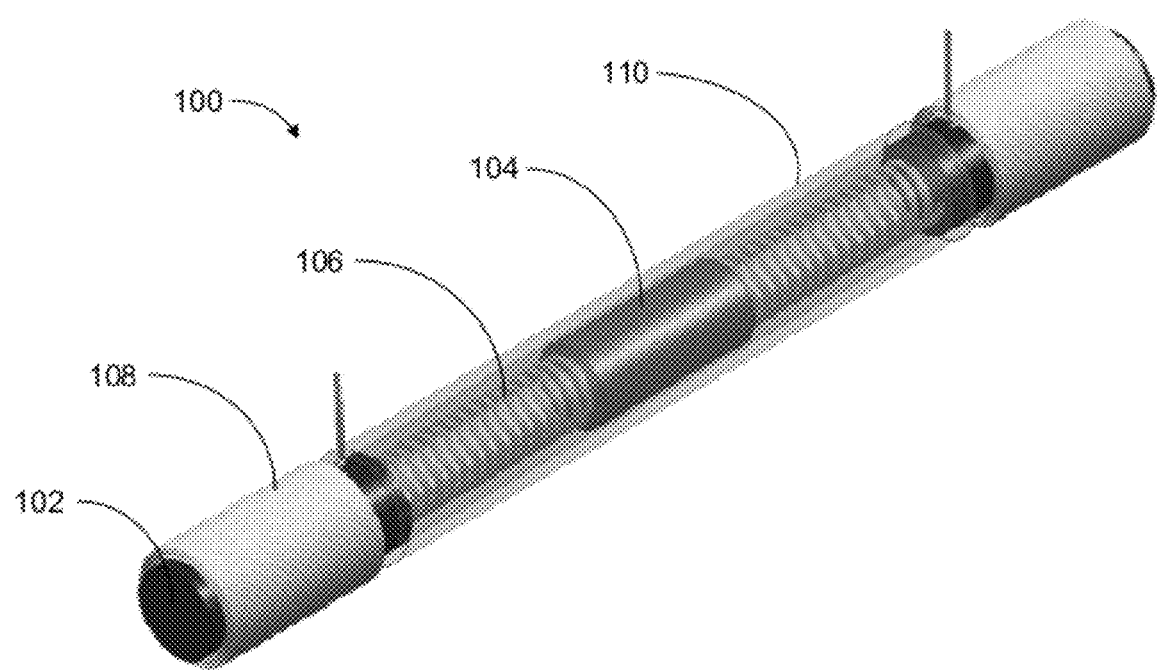
FIG. 2 depicts perspective view of a schematic diagram of one embodiment of an apparatus for energy production comprising a spring element.

In one embodiment of the device, presented in FIGS. 1 and 2, the device 100 utilizes a moving mass 104. In some embodiments, the moving mass 104 is mechanically coupled to at least one spring element 106, which in turn is coupled to at least one component that comprises a magnetic strain material 102. The spring element 106 may have an effective stiffness smaller than that of at least one component that comprises the magnetic strain material 102. In some embodiments, an electrically conductive coil 108 may be used in the vicinity of, and/or wound around the magnetic strain material 102. In other embodiments, the magnetic material 102 may include other materials which vary magnetic properties in response to strain or stress forces. In some embodiments, the magnetic strain material 102 is a magnetostrictive material. One or more sub-components of the device 100 including, without limitation, at least one magnetic strain material 102, at least one moving mass 104, at least one spring element 106 and at least one coil may 108 be incorporated in an outer container 110. The function of the outer container 110 may be, without limitation, environmental protection, reliability enhancement and/or locating and guiding the motion of the moving mass 104.

When the device is mechanically coupled to a component or machine that is vibrating, the vibrations may induce the moving mass to oscillate at some frequency. The motion of the moving mass may cause changes in extensions of at least one spring element that is mechanically coupled with the moving mass, which in turn causes changes in strains and/or stresses within the magnetic strain material. The changes in strain or stress within the magnetic strain material causes changes in at least one magnetic property (e.g., magnetic permeability) of the magnetic strain material, which in turn may result in a current/voltage generated in the electrical coil. The electrical energy thus produced may be utilized as desired by the user of the equipment, or may aid in electrical efficiency enhancement of the component or machine.

It is expected that the amount of power generated will be proportional to approximately the cube of the vibration frequency, as is the case in piezoelectric harvesters. It is also expected that a low damping factor will increase and possibly maximize power generation, therefore embodiments of the design allow for sufficient deflections of the moving mass that can result in an expected energy production at target frequencies.

A potential benefit of one embodiment of this device is the ability to harvest energy from vibration without using any exotic, expensive or unreliable materials.

Other embodiments may include a method for harvesting and/or generating power using a device as described above. Various applications of the device can be construed, and the specific use of such a device in no way limits its scope. Specific embodiments of the device may be used in harvesting energy from ocean waves, wind, structural components, machines and/or vibrating components.

Some embodiments of the device may have more than one spring element and/or one or more components that comprise magnetic strain materials such as piezomagnetic or magnetostrictive materials.

Although embodiments are described herein as including a spring element, some of the embodiments may be implemented with another type of element which has the same or similar elastic properties.

Some embodiments of the device may comprise fixtures that allow the device to be attached readily and cost-effectively to vibrating machinery.

Some embodiments of the device may comprise mechanisms such as roller or sleeve bearings within the outer container that facilitate rapid motion of the moving mass with very low frictional losses.

An embodiment of an energy harvesting device includes at least one flux path composed of at least one material with a relative permeability greater than 100, at least one magnet, at least one magnetic material that has at least one magnetic property that is a function of stress on that material, and a design that allows mechanical load or vibrations to be transferred to that material, at some non-zero frequency. The magnet may be a permanent magnet or an electromagnet, and its function is to provide a bias magnetic field to the magnetic material.

In some embodiments of the device, one specific property that changes with the stress in the material is the magnetic permeability. In another embodiment, the specific property that changes with stress is the saturation magnetization. In one embodiment of the device, there are no air gaps in the flux path. In another embodiment of the device, the magnetic material is a magnetostrictive material. In another embodiment of the device, the magnetic material is put in a state of pre-stress when no external forces are acting on the material, such that when an external force does act, it may partially overcome or add to the pre-stress. In another embodiment of the device, the magnetic material is put in a state of high compressive stress, typically greater than 1000 psi, and in some embodiments greater than 5000 psi.

The device may also comprise conductive coils, such as copper coils that are configured such that changes in magnetic flux through the magnetic material will induce voltage and/or current in the coils. The type and specific configuration of the coils in no way limits the scope of this invention. In addition, the device may comprise various components and structures designed to transfer or carry load that are mechanically coupled directly or indirectly to the magnetic material.

A variety of methods and devices can be envisioned for applying and holding a pre-stress on the magnetic material including but not limited to mechanical loading with loading equipment and mechanical locking, thermal expansion based techniques and incorporation of the pre-stress during materials processing.

In some embodiments, one or more devices may be used in series or parallel.

In some embodiments, the magnetic material is a metal alloy. In some embodiments, the magnetic material is an iron-based alloy. In some embodiments, the iron based alloy may contain other elements including, but not limited, to Al, Co, Cr, Ga, Si, Mo, W, Be. In some embodiments, the magnetic strain material is a terbium-based, nickel-based or cobalt-based material.

In some embodiments of the device, a magnetic flux density change greater than 0.05 Tesla is generated by changes in load on the magnetic strain material. In some embodiments of the device, changes in magnetic flux density greater than 0.3 Tesla can be obtained.

In addition to the change in flux density of the material, there are other important parameters that may determine power generation efficiency as a function of system size and cost.

Given some of the challenges presented by conventional devices, there remains an opportunity for vibration energy harvesting devices that can make significant quantities of electric power (greater than about 0.1 Watts, and in some embodiments greater than about 1 Watt) from the vibrations inherent in various types of industrial equipment while being able to fit into available space for incorporation into or use with such equipment. One example of such an environment is downhole drilling where the available energy in drill string or drill collar vibrations has a moderate frequency (about 0-500 Hz, and more typically about 0-50 Hz) and moderate accelerations (about 0-20 G's, and more typically about 0-5 Gs). Vibration energy harvesting devices in this environment should be able to operate at high temperatures (as high as about 250° C., and more typically as high as about 175° C.). Further, some devices are able to make the required power across the various operating modes of the machinery (for example, different RPMs, weight on bit, etc. for drilling applications) which may include a significant variation in the range of frequencies and accelerations experienced.

Some embodiments of improved methods and designs for harvesting electric power from vibrations use low-cost magnetostrictive materials. In particular, some embodiments produce over 0.1 watts of electric power from mechanical vibrations. Other embodiments produce over 1 watt of electric power from mechanical vibrations.

Embodiments herein facilitate harvesting energy from vibrations external to the device and generating electricity from this energy. In one embodiment, the device includes at least one magnetostrictive element and one or more electrically conductive coils or circuits. The device also includes one or more magnetic circuits which are coupled with one or more electrical circuits to increase or maximize power production. The external vibrations cause a forced oscillation response in the device, and this oscillation causes stress and strain in the magnetostrictive elements, which are converted into electrical energy through electromagnetic induction.

Figure 3:
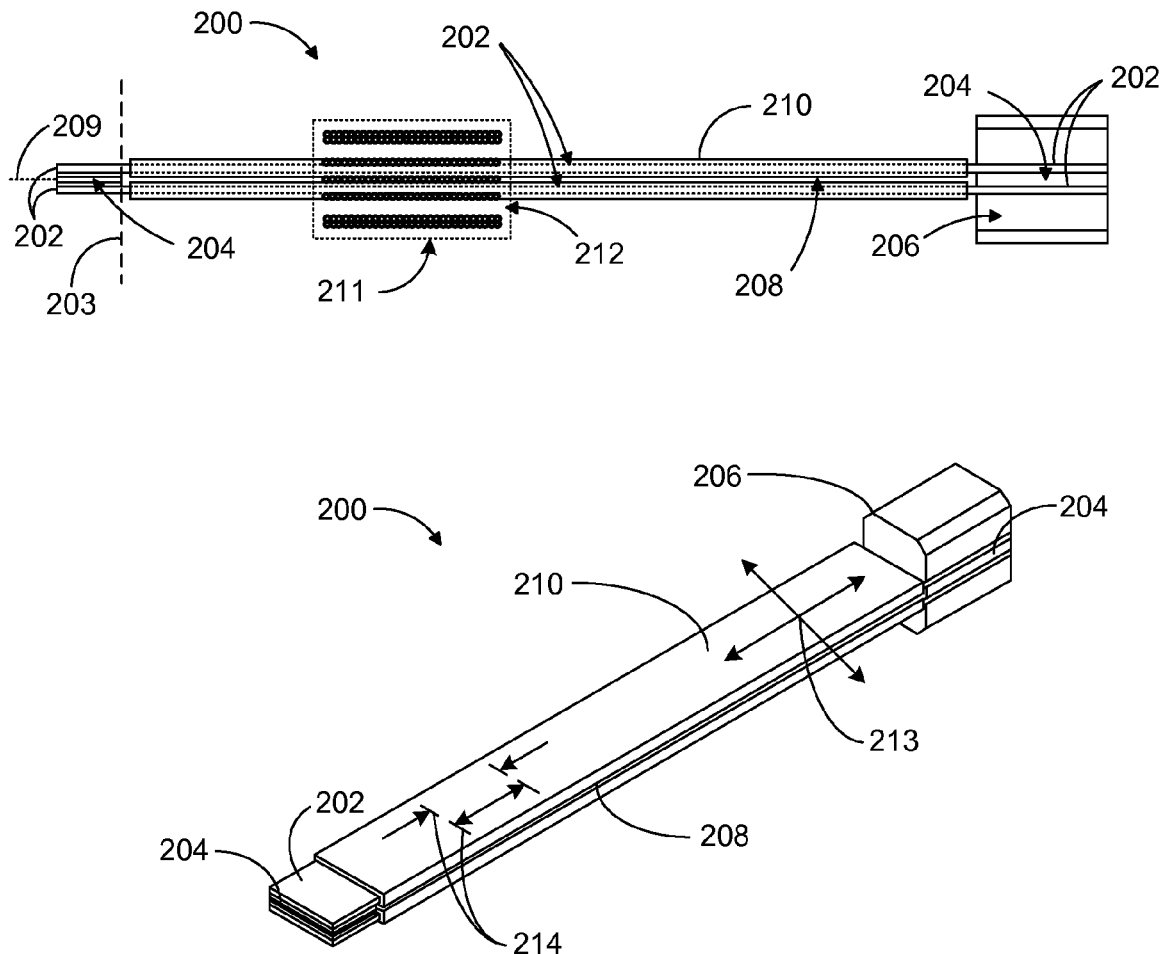
FIG. 3 depicts a side view of a schematic diagram of an apparatus for energy production comprising a beam assembly.

FIG. 3 depicts one embodiment of a device for generating power from vibrations. In one embodiment, electrical power is generated from an environment where vibrations are present or can be produced. The embodiment includes a magnetostrictive beam assembly 200 with two or more magnetostrictive elements 202 which extend along a length of the beam assembly 200; a coil assembly 210 in proximity to the beam assembly 200; a source of magnetomotive force (MMF), including permanent magnet material 204 and/or electromagnets; and a mass assembly 206.

The magnetostrictive elements 202 may be arranged to enable magnetic coupling between them. The magnetostrictive elements 202 also may be arranged to form a beam assembly 200. The beam assembly 200 also may be referred to as a cantilever beam with the fixed end rigidly attached to a supporting structure (e.g., a sidewall of a pipe, a mesh or other grating spanning at least a portion of the inner diameter of a pipe, and so forth, attaching at approximately the mounting region 203) and the free end allowed to oscillate in response to vibration. The vibration movement alters the magnetic characteristics of the magnetostrictive elements 202, which results in electromagnetic induction of a voltage in the coil assembly 210.

In some embodiments, the magnetostrictive elements 202 may be magnetically coupled with external flux path members that have coils around them. The changes in stress/strain in the magnetostrictive elements 202 result in changes in flux in the magnetostrictive elements 202, as well as in the external flux path members, and coils may be placed around the external flux path members and/or the magnetostrictive elements 202 so that the changes in magnetic flux can result in an induced current/voltage in these coils 210. This design allows for the length of the flux path and/or the number of turns of coil 210 to be significantly greater than if coils 210 are wound around the magnetostrictive elements 202 only. Further the average diameter (or significant dimensions) of each turn of coil 210 may be smaller in this configuration than if the coils 210 are wound around the magnetostrictive elements 202 alone (as illustrated by the coils 211 shown in multiple orientations). This can result in a lower device internal resistance for a certain number of turns of coil 210, and consequently higher power density.

In some embodiments, the mass assembly 206 is arranged such that it alters the inertia of the free end of the beam assembly to enable tailoring of the structural natural frequency of the beam assembly to affect, increase, or maximize power production.

In some embodiments, the arrangement of magnetostrictive elements 202 defines a gap 208 between the magnetostrictive elements 202 such that the neutral axis 209 of the beam assembly 200 is located within the gap 208. The presence of the gap 208 between the separate magnetostrictive elements 202 allows a coil 210 assembly to wrap each individual magnetostrictive element 202. The presence of the gap 208 also produces stresses that are purely compressive (or substantially compressive) or purely tensile (or substantially tensile) in each magnetostrictive element 202, depending on the static configuration and the free end displacement. The presence of the gap 208 also allows the individual magnetostrictive elements 202 to forms separate portions of a closed magnetic circuit.

In some embodiments, the magnetostrictive elements 202 are in a state of stress (termed "pre-stress" and illustrated as the compressive or tensile stress 214 of FIG. 3) in the static configuration. This pre-stress may enhance or optimize the change in magnetic characteristics caused by vibration.

In some embodiments, the arrangement of the magnetostrictive elements 202, MMF source 204, and mass assembly 206 form a closed magnetic circuit. This closed magnetic circuit may enhance or maximize the initial magnetic flux and magnetic characteristic changes due to vibration.

A particular embodiment of this device includes at least one magnetostrictive element 202 within a beam assembly 200. While the individual magnetostrictive elements 202 may be conceptualized as individual beams (with lengthwise dimensions that are substantially greater than cross-sectional dimensions), the magnetostrictive elements 202 are not designated herein as beams in order to distinguish between the individual magnetostrictive elements 202 and the overall beam assembly 200. A magnetostrictive element 202, in this context, indicates any structure that is supported at least at one point and can experience loads and deflections. In one embodiment, at least one magnetostrictive element 202 will be supported at least at one end. The magnetostrictive element 202 may have any length or cross-sectional geometry. In some preferred embodiments, the beam will have a substantially rectangular geometry. In an embodiment in which the cross-section of the magnetostrictive elements 202 is rectangular, the longer dimension of the rectangular cross-section is approximately perpendicular to the direction of dominant vibrations in order to increase area while maintaining a desirable structural stiffness.

Some embodiments of the beam assembly 200 contain more than one magnetostrictive element 202. In some embodiments, two or more magnetostrictive elements 202 may be separated by at least one gap 208, which may be an air gap or may include another material or substance within the gap 208.

In some embodiments, the beam assembly 200 is supported at one end so that the magnetostrictive elements 202 are fixed at the supported end. The magnetostrictive elements 202 are also coupled together in a fixed manner at the unsupported end, and the neutral axis of the overall beam assembly 200 is in the gap 208 between the beams, which means that a deflection of the unsupported end of the beam assembly 200 causes an incremental compressive loading in one of the magnetostrictive elements 202 and an incremental tensile loading in the other magnetostrictive element 202. In some embodiments, coils 210 may be wrapped around each magnetostrictive element 202 individually such that the coils 210 pass through the gap 208 between the magnetostrictive elements 202. As mentioned above, the presence of the gap 208 separating the magnetostrictive elements 202 also allows for the magnetostrictive elements 202 to form separate parts of a substantially closed (i.e., without substantial air gaps) magnetic circuit, which could be completed at both ends of the structure by magnetically permeable materials 204 and/or magneto-mechanical force (MMF) sources (e.g., permanent magnet material, electromagnets, etc.). In some embodiments, these materials 204 would be placed in the gap 208 at both ends of the magnetostrictive elements 202 to form a closed flux path.

Winding separate coils 208 around each magnetostrictive element 202 individually facilitates simultaneously utilizing the different forms of mechanical stress in the separate magnetostrictive elements 202, as one of the magnetostrictive elements 202 is in compression while the other magnetostrictive element 202 is in tension. In contrast, if a single coil 210 were wound around the entire beam structure 200 (i.e., around both magnetostrictive elements together), the ability to induce electricity from flux changes would be diminished or entirely prevented due to the cancelling effect of the opposite mechanical stresses in the magnetostrictive elements 202. More specifically, the voltages/currents produced in different portions of the coil 210 near the different magnetostrictive elements 202 would be opposite in sign and, hence, would result in cancellation of some or all of the induced voltage created. Winding separate coils 210 around each magnetostrictive element 202 allows the power generated by each magnetostrictive element 202 to be harvested independently, without such a cancelling effect (or with only trivial or minimized effects).

The beam assembly 200 (and separate magnetostrictive elements) may be supported at one or both ends, at one or more points/locations along the length, or any combination of the above. The specific geometry and location of the beam supports used may impact the locations, magnitude, and directions, of beam deflection, but in no way limit the overall scope of this invention.

In some embodiments, one end or portion of the beam assembly 200 is fixed relative to the vibration source (i.e., relative to the vibrating equipment, device, or structure from with electric power is to be harvested), and the other end or portion(s) are allowed to move freely, thus forming a cantilever arrangement or other arrangement which allows for some deflection of a portion of the beam assembly 200. In some embodiments, the free end of the beam assembly 200 could have a mass 206 added to it to affect the natural frequency of deflection. An example of this embodiment is shown in FIG. 3. To reduce the volume occupied by this mass 206, in some embodiments a material with very high density such as tungsten may be used for this mass. The mass 206 may be of different materials and/or geometries, and if greater mass is needed, geometries that allow as much space within the packaging that can be utilized will be preferred. The specific material or geometry of the mass 206 used in no way limits the scope of this invention. In some embodiments, the shape of the geometry is tailored to a specific operating condition and/or environment, for example, to magnify vibrations, to control oscillation periods, to facilitate fluid flow past the mass 206 (in the exemplary directions 213 of FIG. 3), or to accommodate another operating condition.

In a specific embodiment, the dimensions of the device and the amount of added mass can be varied to match the natural frequency of the structure to the dominant frequency of the vibration source in order to increase or maximize power output. The structural stiffness is directly proportional to the natural frequency, whereas the added mass has an inverse relationship to the natural frequency.

The generator can be modeled as a single degree-of-freedom mass-spring-damper second order system with base excitation. The position of the base (y(t)) is taken to vary sinusoidally with an amplitude Y and a frequency ω. If x(t) is the location of the mass in the inertial reference frame, the equation of motion is:

$$m z_2 + c z_1 + k z_0 + F_g = m \omega^2 Y \sin \omega t$$

where z=x−y is the deflection of the cantilever tip relative to the base, m is the added mass, c is the damping of the system, k is the spring constant, and $F_g$ is the reactive force of the generator. The spring constant for the structure is then $$k = \frac{3EI}{l^3},$$

where E is Young's modulus of the beam material, I is the moment of inertia, and l is the length of the beam. The reactive force of the generator can be modeled as:

$$F_g = \left(B_0 + \frac{dB}{d\sigma}\frac{d\sigma}{dz}\Delta z\right) i l_c$$

where $B_0$ is the static flux density, i is the time-varying current, and $l_c$ is the length of the wire in the coil. The current can be found by summing the voltages around the series circuit that includes the coil (represented by its internal resistance and inductance, in series) and the load resistance, yielding:

$$i = \frac{NA}{R}\frac{dB}{d\sigma}\frac{d\sigma}{dz} z_1 - \frac{L}{R}\frac{di}{dt}$$

where N is the number of turns in the coils, A is the cross-sectional area of the coils, L is the coil inductance, and R is the sum of the internal and load resistance.

Figure 4:
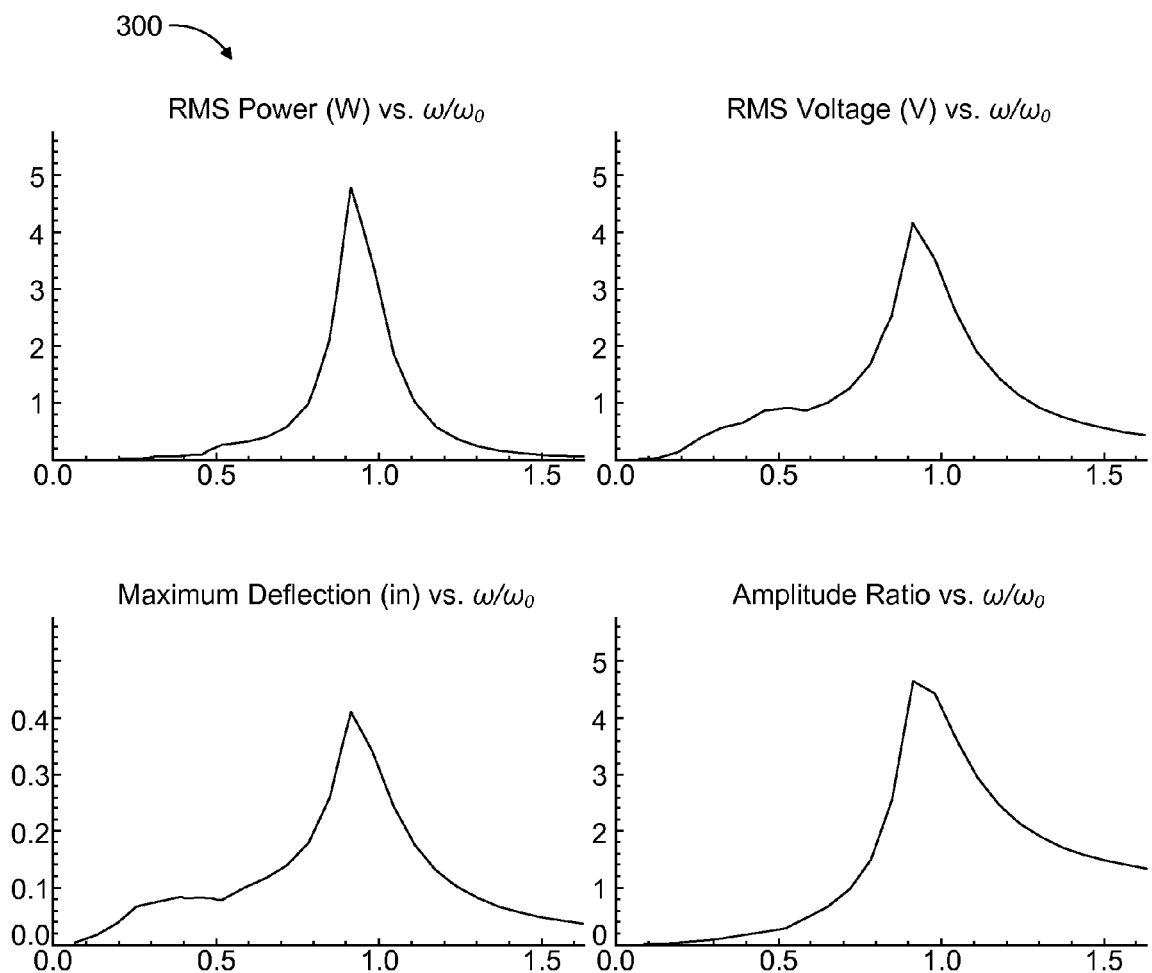
FIG. 4 depicts the results of a response of a particular embodiment of the apparatus for energy production to a vibration input.

Numerical modeling of this embodiment has illustrated the ability of an embodiment to produce significant amounts of power. FIG. 4 shows the response 300 of a particular embodiment to a vibration input. The specifics of the simulation are given in Table 1.

TABLE 1

| Specifications of Simulation | |
| --- | --- |
| Cantilever Dimensions | |
| Length | 16 in |
| width | 1.5 in |
| Beam Thickness | 0.125 in |
| Gap between beams | 0.2 in |
| Electro-Magnetics | |
| Max σ | 60 MPa |
| Max ΔB | 0.4 T |
| Wire Gauge | 20 AWG |

TABLE 1-continued

| Specifications of Simulation | |
| --- | --- |
| Wire Layers | 2 |
| Turns per coil | 914 |
| # coils | 2 |
| Total Coil Resistance | 5.13 Ω |
| Vibration | |
| Max Acceleration (constant) | 5 G's |
| Damping Ratio | 0.1 |
| Natural Frequency | 23.7 Hz |

Figure 5:
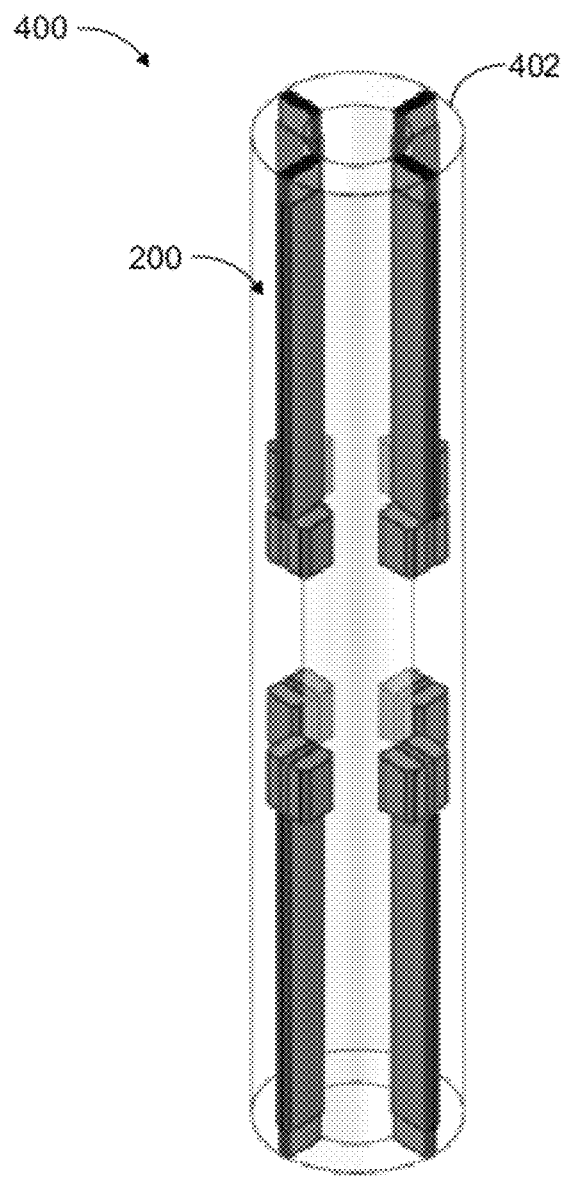
FIG. 5 depicts perspective view of a schematic diagram of an apparatus for energy production comprising a beam assembly.

One possible application of the device is to provide electric power in remote locations. Some embodiments of the device may be configured as a downhole power source for electronic equipment in drilling or well formation/completion applications, or for trickle charging batteries or other energy storage devices. In some embodiments, multiple devices 100, 200 may be housed inside a single enclosure 402. An example of this embodiment is shown in FIG. 5, where the enclosure is an annular structure. Each device could be designed such that its natural frequency is slightly different from the other devices in the enclosure, which would allow for more power production across a range of vibration frequencies. The orientation of each device could also be varied in order to capture the vibrational energy in many directions (the embodiment illustrated in FIG. 5 would capture vibrations in the radial direction of the annulus). In another embodiment, one or more of the beam assemblies may be oriented at a different angle with respect to the radii of the pipe 402. For example, in one embodiment, the beam assemblies 200 may be rotated approximately 90 degrees from the illustrated position so that the vibrational movement is in the radial direction. In another example, some of the beam assemblies 200 may be aligned with radial directions while other beam assemblies 200 are aligned with annular directions. Each device may be magnetically isolated from the other devices and the enclosure in order to maintain the integrity of the magnetic circuit.

Some embodiments may be particularly useful in mounting around drill strings, drill collars, etc. Some embodiments of the device may be used in combination with and/or integrated into other devices/tools used downhole. These tools/devices may be located on the bottom hole assembly (BHA). These tools/devices may include, without limitation, measurement while drilling (MWD) tools, logging while drilling (LWD) tools, power packs, acoustic and/or electromagnetic signal generators, acoustic and/or electromagnetic signal boosters, acoustic and/or electromagnetic signal transmitters/repeaters, and so forth.

The device may also include or be used in combination with power electronics to convert the output electrical energy into a more desirable form. These electronics may include, without limitation, capacitive reactive power correction, single and/or poly-phase rectification (active and or passive), voltage regulation, voltage multipliers and/or transformers for increasing or decreasing voltage, buck, boost or buck-boost converters, voltage and/or current modulation, and other subcomponents.

Some embodiments of this device are particularly suitable to use with low cost magnetostrictive alloys, and do not require the use of the more expensive, supply-limited giant magnetostrictive materials that have terbium or gallium as part of their composition. Some embodiments of this device utilize metal alloys where iron and aluminum are the main constituents as the magnetostrictive elements. Some embodiments of the device utilize metal alloys that contain iron and aluminum where the iron atomic weight % is at least 75% and the aluminum atomic weight % is at least 2%. More specifically, some embodiments of the device utilize metal alloys that contain iron and aluminum where the iron atomic weight % is at least 80% and the aluminum atomic weight % is at least 12%. More specifically, some embodiments of the device utilize metal alloys that contain iron and aluminum where the iron atomic weight % is 81-83% and the aluminum atomic weight % is 17-19%.

In some embodiments, the conductive coil may be wound directly on the magnetostrictive elements. In some other embodiments, the coil may be designed such that there is some clearance between each magnetostrictive element and the corresponding coil, where the deflection of the magnetostrictive element can be accommodated (as shown by the clearance 212 of FIG. 3). In some embodiments, the coil may be mechanically coupled to the magnetostrictive elements or the external packaging with bonding materials or fixtures, which may include without limitation screws, bolts, epoxies (e.g., high temperature epoxies) or other adhesives or other methods familiar to those skilled in the art. Embodiments where the coil may be wound on or otherwise mechanically coupled to the magnetostrictive elements may result in higher effective beam stiffness than in cases where the coil is not mechanically coupled to the magnetostrictive elements. Such an increase in beam stiffness may require design changes such as added mass to keep the natural frequency of the overall beam assembly at a desired target frequency. Designs where the coil is mechanically coupled to the magnetostrictive element may be, in some cases, easier to assemble.

In some embodiments, the magnets are rare earth permanent magnets with ability to operate at higher temperatures. In some embodiments, particular grades of rare earth Nd—Fe—B permanent magnets that can operate up to 200° C. may be used (for instance "NEH"). In some embodiments, samarium-cobalt based rare earth permanent magnets that can be used up to 300° C. may be used.

Since the cross-sectional area of the magnetostrictive elements is small compared with the length, care must be taken not to have the magnetomotive force (MMF) too high or flux path magnetic reluctance too low so as to saturate all or some of the flux path components. The magnetomotive force (MMF) may be lowered by any number of methods known to those skilled in the art, including without limitation, using magnets with reduced thickness (or reduced volume) or using different magnet materials with lower coercivity. The circuit reluctance may be adjusted by using any number of methods familiar to those skilled in the art, including without limitation, using materials in the flux path with relatively low relative magnetic permeability (e.g. steels with relatively permeability lower than 100), introducing very small air gaps or spacers of very small thickness and extremely small relative permeability (e.g., aluminum).

Since magnetostrictive alloy materials generally have less mechanical strength and fracture toughness relative to structural alloys, some embodiments will incorporate manufacturing processes and designs that can result in enhanced component reliability during operation. These techniques may include, without limitation, hot/cold rolling (or otherwise mechanically working) the magnetostrictive elements during manufacturing or pre-compressing the magnetostrictive elements to a load level where the stress will never become tensile (or exceed a design stress target) during operation.

In addition to providing enhanced reliability, pre-stressing can also provide enhanced mechano-magnetic performance and therefore enhanced power densities. Therefore, some embodiments of the device may incorporate some form of pre-compression of the alloy materials in the beam. This may be done by any number of methods familiar to those skilled in the art. As one example, this may be accomplished by mechanical pre-stressing or thermal pre-stressing. Mechanical pre-stressing may be accomplished through the use of compression fixtures in which the alloy is tightened down using bolts. Thermal pre-stressing may be accomplished by incorporating the beam into an external loading fixture at an elevated temperature above the expected temperature of operation. When the fixture is at the effective temperature of operation, the beam will be in compression. By designing the geometry of the fixture relative to the beam, a design target stress can be attained.

Rare earth permanent magnet materials, being non-structural ceramics, are intrinsically brittle and have low fracture toughness. Therefore, some embodiments of the device will incorporate design features that will allow the magnet materials to be packaged so that they can survive mechanical shock and vibration. This may be accomplished by any number of methods familiar to those skilled in the art, including without limitation methods by which the magnets may be compressed down using soft and/or ductile materials.

Further, some embodiments will include reliable packaging which will not only protect the internal components of the device from hot corrosive liquids and gases, as well as from drilling mud and any other constituents of the operating environment. Some embodiments may also incorporate a partial of full vacuum within the packaging to minimize mechanical damping effects due to air resistance acting on the beam assembly.

In one embodiment, the power generation concept involves using the vibration energy to excite a mass that results in motion of the excited mass. The oscillating moving mass creates changes in the stress/strain within the magnetostrictive material which in turn creates changes in the magnetic permeability of the magnetostrictive material. The system design includes a biasing magnet and a closed loop magnetic circuit such that when changes in the stress/strain of the magnetostrictive material occur the result is a change in magnetic flux through the closed loop flux path. The changes in magnetic flux are then used to generate electrical power in an induction coil that surrounds the magnetostrictive material.

Figure 6:
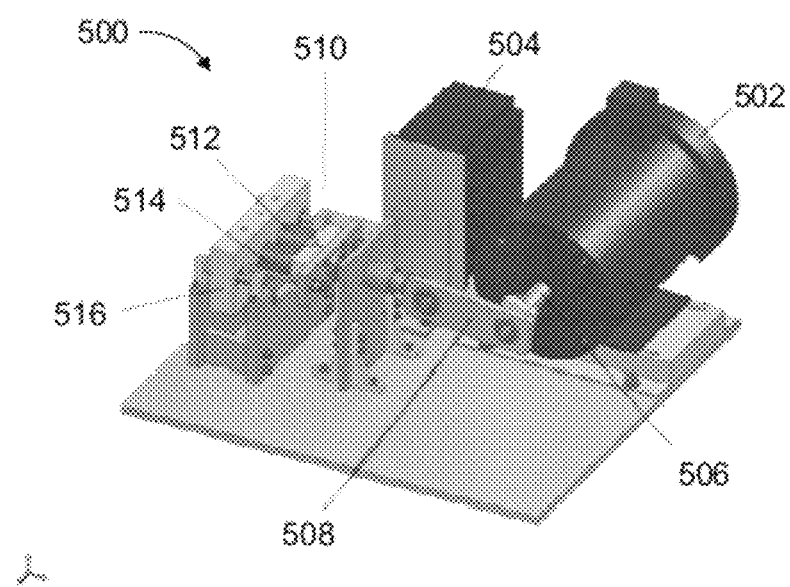
FIG. 6 depicts a schematic diagram of an experimental apparatus for simulating energy generation of an apparatus for energy production.

FIG. 6 shows a schematic drawing of the experimental apparatus 500. In one embodiment, to simulate the vibration energy typical of a downhole drilling application, a 1 HP AC 502 motor was installed with a VFD (variable frequency drive) 504 controller that allows for easy control of motor speed. The shaft of the motor 506 is connected to the vibration energy harvester device 510 by a crank arm 508. The vibration energy harvesting device consists of two magnetostrictive alloy rods 514 that are surrounded by induction coils 512. Attached to the ends of the magnetostrictive alloy rods 514 is a large metal block 516 that provides the moving mass which generates the stress/strain in the magnetostrictive alloy rods 514. As the motor shaft spins the connected crank arm creates linear oscillating motion to the energy generation device. For each revolution, or stroke, the moving mass is oscillated back and forth thereby creating a changing stress state in the two magnetostrictive alloy rods. The change is stress states results in a change in magnetic permeability and magnetic flux which in turn induces a voltage in the surrounding induction coil, thus generating electrical power.

Figure 7:
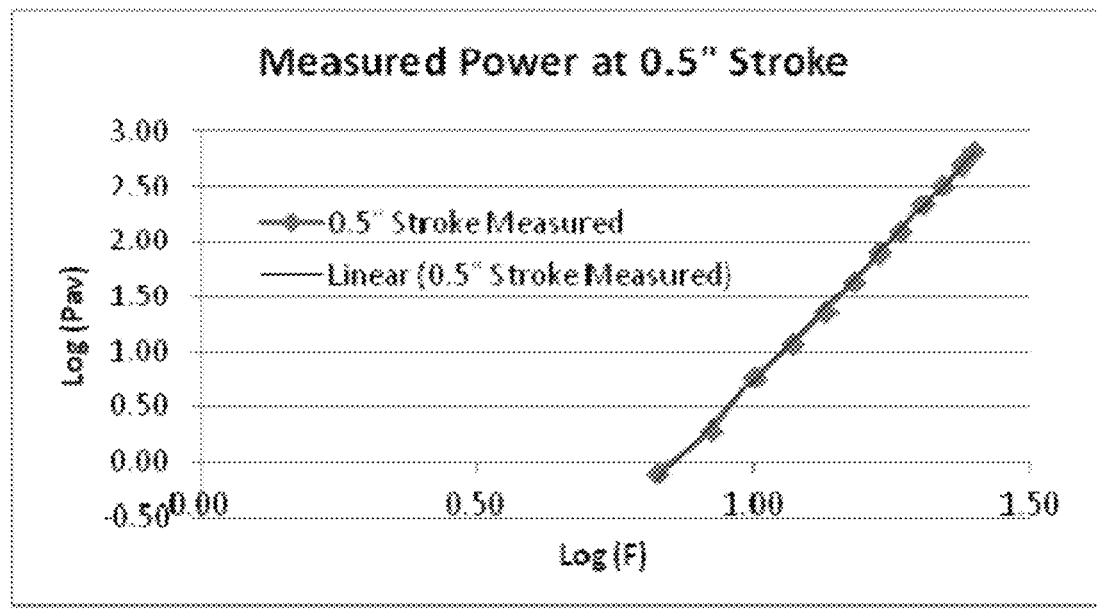
FIG. 7 depicts the results of power production from the apparatus depicted in FIG. 6.

In a series of experiments run on the apparatus 500 of FIG. 6, experimental results were obtained and are presented in FIG. 7. The resulting power is a function of the frequency. Theoretically, the power is related to the $6^{th}$ power of the frequency in this configuration for a fixed displacement.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A mechanical energy harvesting apparatus comprising:
    a mechanical assembly comprising a moving mass configured to move due to an action of an external source of energy; and
    a cantilever magnetostrictive energy harvester mechanically coupled to the moving mass, wherein the moving mass is fixed at a free end of the magnetostrictive energy harvester, the magnetostrictive energy harvester comprising:
        at least two magnetostrictive elements comprising a magnetostrictive material disposed within a substantially closed magnetic circuit, wherein the at least two magnetostrictive elements provide structural support to mechanically support the free end, and wherein the at least two magnetostrictive elements are separated by a gap, wherein the gap comprises air;
        a plurality of electrically conductive coils, wherein each coil is wrapped around a corresponding magnetostrictive element, and wherein changes in magnetic flux in each magnetostrictive element induce electrical energy in the corresponding electrically conductive coil; and
        a magnet configured to act as a source of magnetomotive force within the substantially closed magnetic circuit;
    wherein movement of the moving mass, which is directly attached to the at least two magnetostrictive elements, induces force or strain on the magnetostrictive material to change a magnetic property of the magnetostrictive material, wherein the change of the magnetic property of the magnetostrictive material results in a change in magnetic flux within the substantially closed magnetic circuit, and induces electrical energy in the plurality of electrically conductive coils; and
    wherein the substantially closed magnetic circuit comprises a continuous physical loop along the at least two magnetostrictive elements and between corresponding ends of the at least two magnetostrictive elements.

2. The mechanical energy harvesting apparatus of claim 1, wherein a first end of the magnetostrictive energy harvester is fixed relative to the mechanical energy harvesting apparatus.

3. The mechanical energy harvesting apparatus of claim 1, wherein the moving mass is configured to oscillate in response to the action of the external source of energy, wherein the oscillating path is primarily a one-dimensional path.

4. An apparatus for energy production comprising:
    a cantilever beam assembly with a fixed end and a free end, the cantilever beam comprising at least two magnetostrictive elements spanning a length between the fixed and free end of the cantilever beam assembly, wherein the at least two magnetostrictive elements provide structural support to mechanically support the free end relative to the fixed end, and wherein the at least two magnetostrictive elements are separated by a gap, wherein the gap comprises air;
    a substantially closed magnetic circuit passing through the at least two magnetostrictive elements, wherein the substantially closed magnetic circuit comprises an unbroken/continuous physical connection along the at least two magnetostrictive elements and between corresponding ends of the at least two magnetostrictive elements to form a continuous physical loop;
    a plurality of electrically conductive coils, wherein each coil is wrapped around a corresponding magnetostrictive element, and wherein changes in magnetic flux in each magnetostrictive element induce electrical energy in the corresponding electrically conductive coil; and
    a moving mass fixed to the free end of the cantilever beam, wherein movement of the moving mass results in changes in stress in the at least two magnetostrictive elements, and wherein a first magnetostrictive element experiences a compressive stress and a second magnetostrictive element experiences a tensile stress as the moving mass moves relative to the fixed end of the cantilever beam assembly.

5. The apparatus of claim 4, wherein each of the ends of the at least two magnetostrictive elements are magnetically coupled by a magnetically permeable material to form the substantially closed loop magnetic circuit with the at least two magnetostrictive elements.

6. The apparatus of claim 4, wherein the substantially closed loop magnetic circuit comprises a permanent magnet.

7. The apparatus of claim 4, wherein at least one of the electrically conductive coils passes through a space between the at least two magnetostrictive elements.

8. The apparatus of claim 4, further comprising a mounting structure at the fixed end of the cantilever beam assembly, wherein the mounting structure is configured to facilitate mounting of the cantilever beam structure within a fluid path in a downhole application.

9. The apparatus of claim 4, wherein each of the at least one electrically conductive coils is separated from each corresponding magnetostrictive element by a clearance, the clearance to accommodate a deflection of the cantilever beam assembly.

10. The apparatus of claim 4, wherein a neutral axis of the cantilever beam assembly is at least partially within the gap between the at least two magnetostrictive elements.

11. The apparatus of claim 4, wherein the gap comprises a material.

12. The apparatus of claim 4, wherein one or more of the at least two magnetostrictive elements is pre-stressed in a static position.

* * * * *